(12) United States Patent
Ravi et al.

(10) Patent No.: US 9,735,952 B2
(45) Date of Patent: Aug. 15, 2017

(54) CALIBRATION OF DYNAMIC ERROR IN HIGH RESOLUTION DIGITAL-TO-TIME CONVERTERS

(71) Applicant: Intel IP Corporation, Santa Clara, CA (US)

(72) Inventors: Ashoke Ravi, Hillsboro, OR (US); Ofir Degani, Haifa (IL); Rotem Banin, Pardes-Hana (IL); Assaf Ben-Bassat, Haifa (IL)

(73) Assignee: Intel IP Corporation, Santa Clara, CA (US)

( * ) Notice: Subject to any disclaimer, the term of this patent is extended or adjusted under 35 U.S.C. 154(b) by 66 days.

(21) Appl. No.: 14/861,132

(22) Filed: Sep. 22, 2015

(65) Prior Publication Data
US 2017/0085365 A1    Mar. 23, 2017

(51) Int. Cl.
| H04B 15/00 | (2006.01) |
| H04L 7/04 | (2006.01) |
| H04L 7/00 | (2006.01) |
| H04B 1/04 | (2006.01) |
| G04F 10/00 | (2006.01) |
| H03K 5/135 | (2006.01) |
| H03M 1/10 | (2006.01) |
| H03M 1/82 | (2006.01) |

(52) U.S. Cl.
CPC ............ *H04L 7/042* (2013.01); *G04F 10/005* (2013.01); *H03K 5/135* (2013.01); *H03M 1/1061* (2013.01); *H04B 1/0475* (2013.01); *H04L 7/0054* (2013.01); *H03M 1/82* (2013.01)

(58) Field of Classification Search
CPC ..... H04B 17/21; H04B 1/0475; G04F 10/005; H04L 7/042; H04L 7/0054; H03M 1/82
See application file for complete search history.

(56) References Cited

U.S. PATENT DOCUMENTS

| 4,742,331 A | 5/1988 | Barrow et al. |
| 5,489,864 A | 2/1996 | Ashuri |
| 8,222,966 B2 | 7/2012 | Ravi et al. |
| (Continued) | | |

OTHER PUBLICATIONS

B. Wang et al., "A digital to time converter with fully digital calibration scheme for ultra-low power ADPLL in 40 nm CMOS," 2015 IEEE International Symposium on Circuits and Systems (ISCAS), Lisbon, 2015, pp. 2289-2292.*

(Continued)

*Primary Examiner* — Daniel Washburn
*Assistant Examiner* — Amneet Singh
(74) *Attorney, Agent, or Firm* — Eschweiler & Potashnik, LLC

(57) ABSTRACT

A calibration system operates to calibrate or correct a digital-to-time converter (DTC) that comprises a detector component and a distortion correction component. The DTC can receive one or more signals and a digital code to generate a modulation signal by controlling an offset of the one or more signals based on the digital code. The detector component can comprise a TDC or another DTC that operates to measure a dynamic behavior in response to detecting nonlinearities of the modulation signal. The distortion correction component can generate a set of distortion data that removes the dynamic behavior from an output of the DTC based on the measurement.

22 Claims, 7 Drawing Sheets

(56) References Cited

U.S. PATENT DOCUMENTS

| | | | |
|---|---|---|---|
| 8,362,815 B2 | 1/2013 | Pavlovic et al. | |
| 8,497,716 B2 | 7/2013 | Zhang | |
| 2011/0156783 A1* | 6/2011 | Pavlovic | H03L 7/081 327/159 |
| 2013/0093471 A1 | 4/2013 | Cho et al. | |
| 2014/0002288 A1 | 1/2014 | Scholz | |
| 2014/0176201 A1* | 6/2014 | Weltin-Wu | H03K 5/131 327/115 |
| 2014/0266822 A1* | 9/2014 | Henzler | G04F 10/005 341/118 |
| 2014/0266837 A1 | 9/2014 | Henzler et al. | |
| 2015/0036767 A1 | 2/2015 | Degani et al. | |
| 2015/0188583 A1 | 7/2015 | Ravi et al. | |
| 2016/0182098 A1* | 6/2016 | Seebacher | H04B 1/0475 375/296 |

OTHER PUBLICATIONS

S. Levantino, G. Marzin and C. Samori, "An Adaptive Pre-Distortion Technique to Mitigate the DTC Nonlinearity in Digital PLLs," in IEEE Journal of Solid-State Circuits, vol. 49, No. 8, pp. 1762-1772, Aug. 2014.*

Jiayoon Zhiyu Ru, et al.; "A High-Linearity Digital-to-Time Converter Technique: Constant-Slope Charging", IEEE Journal of Solid-State Circuits, vol. 50, No. 6, Jun. 2015, p. 1412-1423.

Texas Instruments; "Understanding Data Converters: Application Report", Mixed-Signal Products SLAA013, Published in 1999, p. 1-22.

Gordon Roberts; "A Brief Introduction to Time-to-Digital and Digital-to-Time Converters"; ResearchGate; http://www.researchgate.net/publication/224126917, p. 6, Apr. 2010.

U.S. Appl. No. 14/998,238, filed Dec. 23, 2015.

Notice of Allowance Dated Aug. 23, 2016 U.S. Appl. No. 14/998,238.

Satosh, et al.: "Stochastic TCD Architecture with Self-Calibration", Circuits and Systems (APCCAS, 2010 IEEE Asia Pacific Conference on, IEEE, Dec. 6, 2010, pp. 1027-1030, XP031875726.

International Search Report Dated Nov. 22, 2016 PCT/US2016/047982.

Non Final Office Action Dated May 10, 2016 U.S. Appl. No. 14/998,238.

* cited by examiner

CALIBRATION OF DYNAMIC ERROR IN HIGH RESOLUTION DIGITAL-TO-TIME CONVERTERS

FIELD

The present disclosure relates to digital-to-time converters (DTC)s, and more specifically, the calibration of dynamic error in high resolution DTCs.

BACKGROUND

Digital to time converters (DTCs) are a very promising solution for a number of applications such as digital polar transmitters, fractional-n clocking or others. Due to improved system key performance indicators (KPI)s that DTCs enable even more applications apply, such as improving radio transmitter efficiency, support for wide-bandwidth modulation, generation of multiple carrier frequencies without requiring inductors, pulling immunity, the ease of porting to new process technology nodes, and the like. In order to meet the modulation quality (EVM), spectral emissions, spurs and coexistence requirements, the typical resolution of the DTC for these applications in demand can be in the order of 13-14 bits. This translates to the requirement of a 30-100 fs quantization step with a 200-500 ps range and a jitter power spectral density of approximately equal to −160 dBc/Hz. Phased-locked loop-based solutions can typically be used to generate the phase modulation signals for narrow-band standards (e.g., up to 4 MHz) such as GSM/EDGE, Bluetooth and WCDMA. However, PLLs do not typically deliver the demanded EVM and spectral emission (mask) for wider bandwidth standards such as WiFi and LTE.

DETAILED DESCRIPTION

Figure 1:
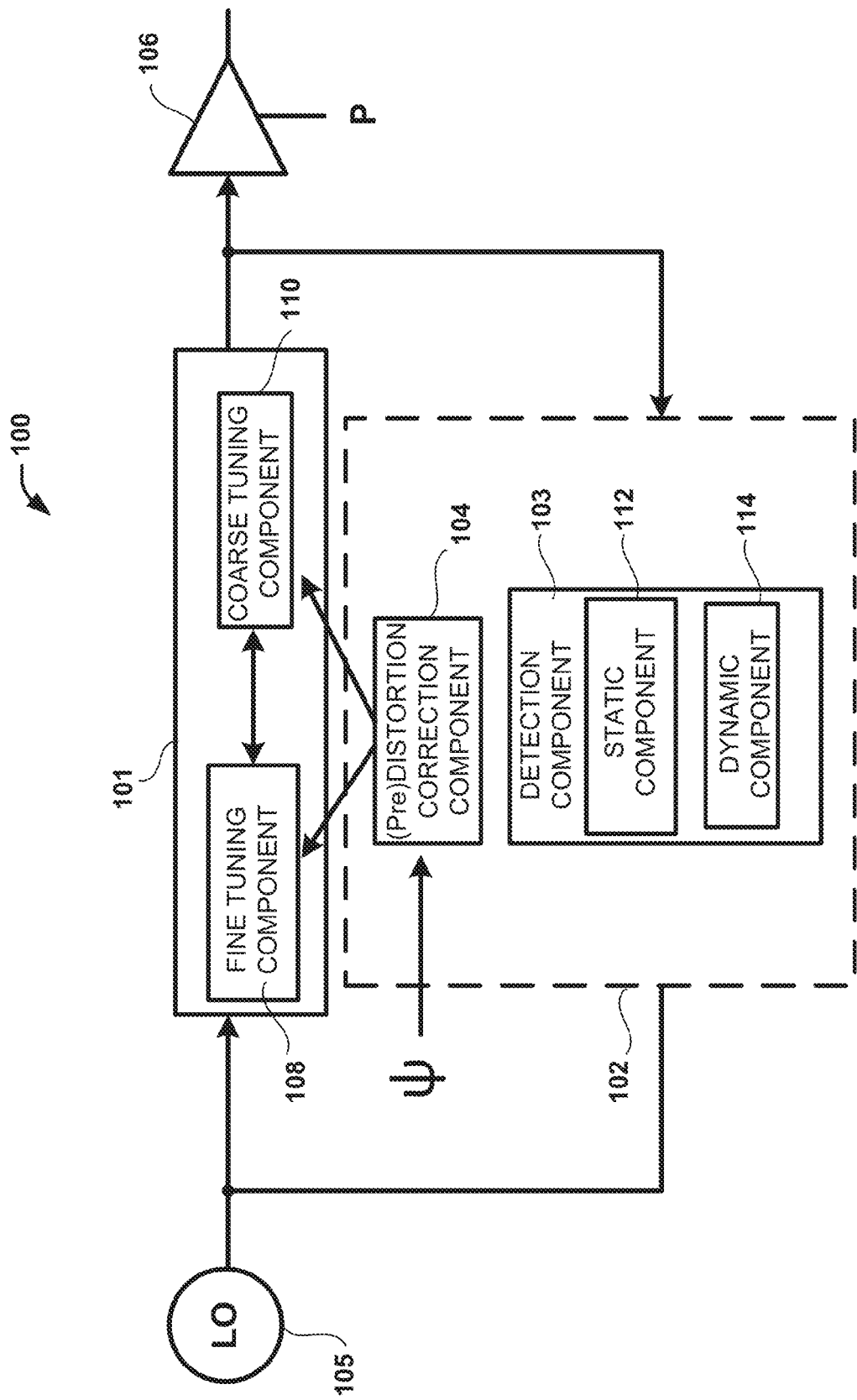
FIG. 1 is a functional block diagram illustrating a wireless communication system or device with an example of a digital-to-time converter (DTC) calibration scheme architecture according to various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC, an electronic circuit and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of wireless/mobile communication systems and devices comprising digital-to-time converters (DTCs), various aspects are described in this disclosure for addressing the non-linearity in the code-delay transfer function. The non-linearity exhibited by a DTC can include 1) a code dependent static error, which comprises a steady state response variation from an ideal/reference value; and 2) a time-varying error, which is created during transitions from one code to another code being received.

Although time-varying errors can be caused by digital code switching activity and dynamic changes in the operation of the DTC in response to the code transitions, these errors can also be filtered and acted upon by the voltage regulators and decoupling capacitors in a communication system. As a result, the dynamic errors can extend or last for multiple periods of the input clock after a code transition from one level to another or the digital code has been incremented to a different level (analogous to a fast memory effect). Further, the magnitude of the dynamic error can depend on the code transition. Because phase modulation and carrier shift applications can change the DTC code every clock period, a time-varying sequence of dynamic errors can result and not be accommodated for without particular measures.

In consequence, the static (integral non-linearity) and dynamic errors distort the applied phase modulation provided by a DTC, degrade the spectral emissions and introduce spurious signals. The systems and device components herein can accurately measure and correct for both static and dynamic errors within DTC devices in order to achieve the desired system performance. Additional aspects and details of the disclosure are further described below with reference to figures.

Referring to FIG. 1, illustrated is a wireless communication system 100 or device in accordance with various embodiments being described. The wireless communication system 100 also comprises a mobile or wireless device having various components being illustrated for signal communication (e.g., a mobile device, a computing device, a processing device or the like) that is configured to communicate in one or more different operating bands (e.g., CDMA, GSM, LTE, LTE-A, or the like) with different data streams simultaneously or concurrently in different frequency ranges, such as with carrier aggregation (CA) or other simultaneous communication schemes for achieving higher data rates.

The wireless system 100 can include a radio frequency (RF) device (e.g., a transmitter, a receiver, a transceiver, for communicating RF signals, an acoustic device for communicating acoustic signals, or other data signal communication device, such as a computer, a personal digital assistant, a mobile phone or smart phone, a tablet PC, a modem, a notebook, a router, a switch, a repeater, a PC, network device, base station or other wireless device that can operate to communicate with a network or other device according to one or more different communication protocols or standards and simultaneous communication schemes (e.g., carrier aggregation or the like).

The system 100 can be configured for measuring, correcting, and tracking DTC non-linearity without interrupting the normal operations of a digital-to-time converter (DTC) 101. In one aspect, DTC non-linearity (e.g., static or dynamic non-linearity) can be measured and corrected during a power-on sequence. Alternatively or additionally, the DTC non-linearity can be tracked and corrected as the DTC 101 operates in active transmission or for carrier generation during the reception of data.

The system 100 provides an example of calibration architecture 100 for the DTC 101, which can comprise a DTC-based digital polar transmitter, other type transmitter, receiver or transceiver device, for example, which can receive an original signal (e.g., 3G, 4G, WiFi, etc.) and decompose the receive signal into amplitude and phase components for further processing.

In one embodiment, the system 100 can further comprise a calibration and correction component 102, including a detection component 103, a distortion correction component 104 (e.g. a pre-distortion component), a fine tuning component 108 and a coarse tuning component 110. The system 100 is an example architecture, in which one or more components can be internally integrated with the DTC or external to the DTC. The system 100 via the calibration and correction component 102 can calibrate the DTC 101 for ongoing modulation of input signals based on a digital code that controls the delays outputted by the DTC 101. These digital codes can operate to selectively tune or adjust one or more properties of the DTC 101 in order to selectively modulate communication signals within particular frequency bands. These selective adjustments can be implemented by one or more coarse tuning, fine tuning or other tuning operations, for example, in order to dynamically control a time delay or phase of the modulated signal, such as via a coarse tuning component 108 and a fine tuning component 110. For example, the DTC 101 can incorporate both coarse and fine tuning components 108, 110 for tuning of the delays at different resolutions. The calibration and correction component 102 can selectively tune or adjust the delay within the DTC 101 through the digital codes applied (via digital pre-distortion at the distortion correction component 104), or by changing one or more different internal properties (e.g., time delay, phase offset, or the like) of the DTC 101 to eliminate the detected errors.

The DTC 101 is configured to receive reference frequency information from a local oscillator (LO) 105 and can provide phase information or other data to a digital power amplifier 106 via the DTC 101. The digital power amplifier 106 can mix the phase information from the DTC 101 with amplitude information (p) to provide a radio frequency signal for broadcast using an antenna (now shown). The DTC 101 can apply desired phase modulation ($\psi$) to the reference frequency information by adjusting the location of each edge of the reference frequency information or controlling an offset (e.g., a phase offset or a time delay) based on one or more digital codes. Alternatively or additionally, the DTC 101 can be used for receiver LO generation or clock generation as well.

The LO 105, for example, can be utilized in tuning or calibration of the DTC 101, which can involve coarse tuning and fine tuning operations via the coarse and fine tuning components 108, 110 of the device. For example, the LO 105 can be controlled by one or more different capacitor or varactor fields. In another example, a coarse tuning (e.g., tuning a field for a frequency band adjustment) can be implemented with one or more capacitors that is controlled by a binary coding (e.g., a digital code), in which the coarse tuning process selects a frequency band or range and generates coarse quantitating offset of a time delay or a phase offset of the one or more signals to set the device at an operating frequency. However, coarse tuning alone can provide for an inaccurate and unstable phase lock for high-frequency applications. During the locking operation phase for a target frequency of operation and after coarse tuning, the coarse tuning can be kept constant and frequency resolution of the phase locked loop can be enhanced with a fine tuning operation (e.g., setting a tuning field for locking the phase locked loop) in order to compensate for the error in the coarse tuning and to lock/fix the oscillator close to or at a target frequency. The fine tuning component 110, coupled to the coarse tuning component, can receive the coarse quantitating offset, or detect a signal property, and generate a fine quantitating offset of the time delay or the phase offset of the one or more signals based on the distortion data to further tune or set operating properties a finer resolution or a more precise level than the coarse tuning operations. The fine tuning component 110 generates the fine quantitating offset of the modulation signal based on an output of the DTC and a local oscillator signal of the LO 105 propagated through a delay line (e.g., delay line 208, illustrated infra) and captured in a wave-pipelined process via a plurality of flip-flops (e.g., flip-flops 210a-210x, illustrated infra) as or flip flop banks located at different locations along the delay line (e.g., delay line 208, illustrated infra).

In one embodiment, the detection component 103 is configured to receive a modulation signal and detect non-linearities of the DTC 101. Further, the detection component 103 can generate a measurement of one or more properties of a static error or a dynamic error associated with the nonlinearities via the static component 112 and the dynamic component 114, respectively. These properties can be a phase, a differential in relation to time, delays or offset from a reference value, corresponding digital codes, or the other such properties related to the non-linearities of the DTC 101. In particular, a time varying error or a transient response can be analyzed in response to a code transition, or an increment of one digital code to another, which could designate a phase transition from one phase to another via the dynamic component 114, for example. Together with a determination of the static error and the dynamic error the non-linearities can be reduced or eliminated within the DTC 101.

In another embodiment, the detection component 103 can compare differences between the desired phase modulation with differences between the output and input of the DTC 101 (e.g., actual phase modulation) to measure DTC non-linearity. For example, a measurement of DTC non-linearity can be accomplished by comparing each applied phase modulation word (digital code) against the corresponding direct or differential (correlated double sampling) measurement of the detection component 103 for either a static or dynamic error. In certain examples, the measured DTC non-linearity can then be used to provide a map or recipe for the distortion correction component 104 that can be applied to the phase modulation information ($\psi$) to correct the nonlinearity of the DTC 101 via the distortion correction component 104, such as by a pre-distortion, or post-distortion scheme, for example, which can be based on one or more of the dynamic or static errors. As such, the calibration and correction component 104 can generate distortion data that eliminates the dynamic behavior within a code transition of the DTC based on the edge location extracted.

The calibration and correcting component 102, for example, can further operate to construct a histogram or table of measured phase differences or transient responses of the DTC 101 with respect to different codes or code transitions based on the measurements of the detection component 103. The statistics of the desired phase modulation information ($\psi$) or time delay data can be determined from the static non-linearity based on a reference value and an actual value.

In another embodiment, the dynamic non-linearity can be determined from cycles or intervals of time that surround or capture code transitions of the received digital codes, where the code is incrementing or decrementing from one value to another. Based on the dynamic non-linearity or dynamic errors, the DTC 101 non-linearity and code-phase transfer function can be measured for each code transition set from one level or increment to another. Then the correction to be applied to the DTC can be inferred. A table of data or histogram can be generated further to provide a distortion or pre-distortion mapping table for correcting the nonlinearity (both static and dynamic) using the distortion module 104, which is configured to generate a set of distortion data that can mitigate, reduce or eliminate the nonlinearities of the DTC based on the measurement(s) of the detector component 103 via the correction code.

Figure 2:
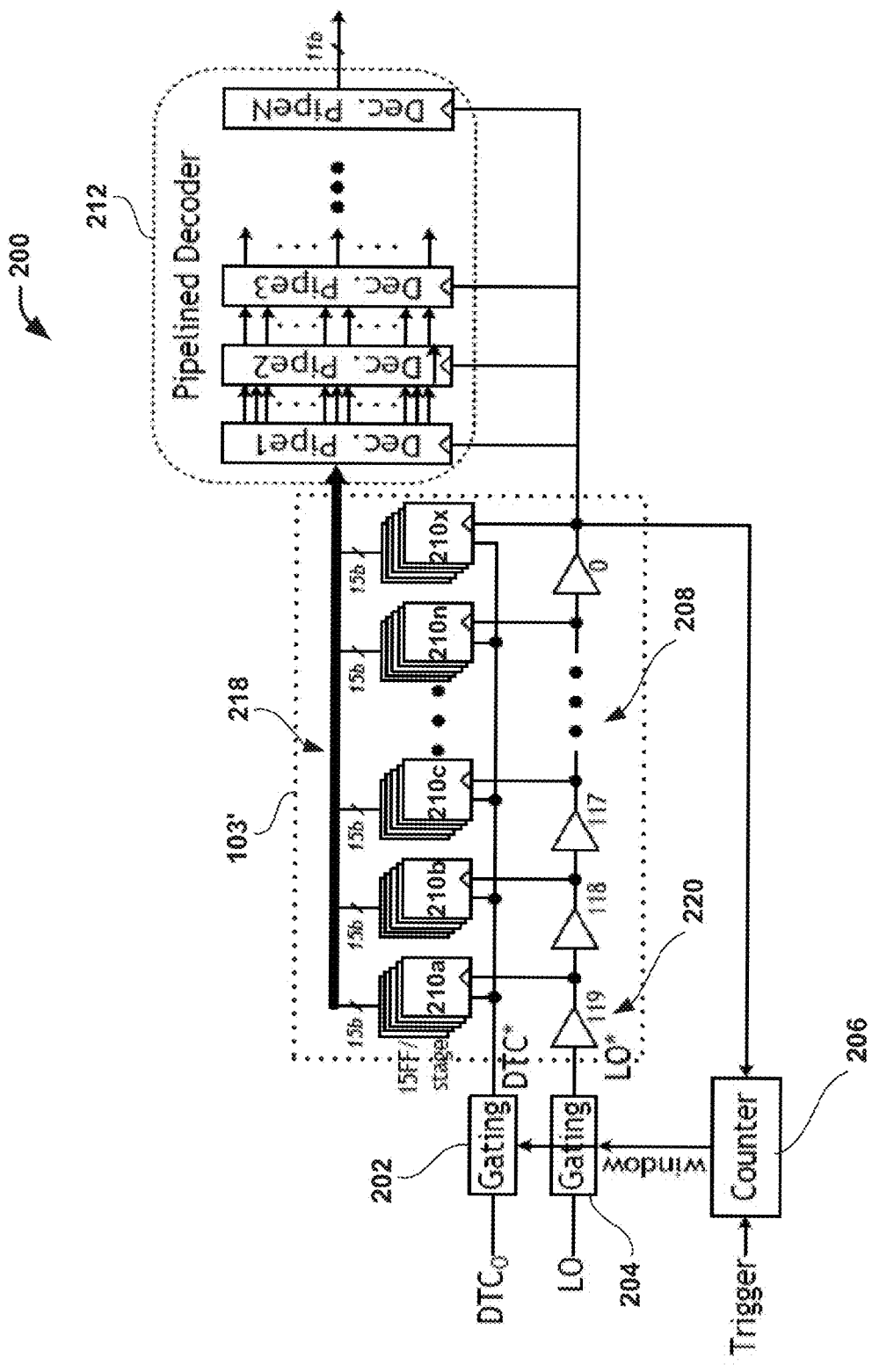
FIG. 2 is another functional block diagram illustrating a wireless communication system or device with an example of a time-digital converter (TDC) in a calibration scheme architecture according to various aspects described.

Referring now to FIG. 2, illustrated is a wireless device 200 for controlling the calibration of a DTC based on a dynamic error calibration scheme in accordance with various aspects. The wireless device 200 comprises the detection component 103', a first gating (segment) component 202, a second gating (segment) component 204, a counter and a pipelined decoder 212.

In one embodiment, the detector component 103' can comprise a time-to-digital converter 103' that receives a DTC output (e.g., $DTC_0$, or other output of DTC 101 of FIG. 1) and an input clock LO (e.g., LO 105). The DTC output $DTC_0$ can be compared against a divided version of the input clock LO (e.g., LO 105) along a delay line 208 to measure any errors. In order to measure the DTC transfer function with high accuracy over the entire operating phase/time range, of the DTC 101, the TDC 103' is segmented between a coarse (e.g., at about 3-5 ps) resolution flash TDC and a fine resolution (e.g., at about 0.5 ps) stochastic TDC as the detector component 103'. Weighted spatial averaging as well as time-domain weighted averaging of multiple measurements by the detector component 103' reduces the TDC quantization noise to a level smaller than the DTC quantization step (~30 fs). The detector 103' then facilitates a reduction in a quantization noise to a level that is smaller than a quantization step of the DTC 101.

The gating circuits or segmenting components 202 and 204 are configured to open a window of a pre-determined number of clock periods around the digital code transitions from one incremental level to another level. As successive edges of the LO and the DTC output $DTC_0$ propagate through the delay line 208, the TDC 103' captures the relative edge locations of the successive periods in a wave-pipelined manner with a set of flip-flops 210a-210x at each location. As a result the TDC 103' only needs to provide a delay coverage (range) of a single clock period with process, voltage, and temperature variation (PVT) margins in order to measure the DTC transients or dynamic behaviors.

Due to variations in the manufacturing, mapping of the digital codes to delays is not a linear mapping. In one example, a DTC with 8 levels or increments could range from 0 to 360 degrees to span an entire range with 8 levels, for example, or other number, so that each level would be the equivalent of about a 45 degrees phase differential, but in reality the steps may not be equal as a result of PVT variations. As such, the static integrated non-linearity (INL) or error is constructed because each code has a mapping to phase, which is not linear, and is either a static or quasi-static to dynamic in nature. Additionally, there is an issue with a dynamic INL with the newly applied transition of each coded transition response. If the digital code is a one at 45 degrees and the DTC is desired to jump to code 4 at 180 degrees, even if there was no static INL when the transition is generated, the behavior of the DTC circuit changes in the time domain resulting in a transient effect.

The gating (segment) components 202 and 204 receive the inputs of the LO and the $DTC_0$, as well as a signal called "window" from the counter 206. The device 200 knows when there is a code change, because it knows what info is coming out, what info it wants to transmit according to a particular sequence in time. The counter 206 can open the window based on a trigger signal and close it when the windowed clock propagates all the way through the delay line 208 and sensed at the output at the feedback input. The window can be a sequence in time around the code changes that is predetermined, for example. In particular, the window signal controls the gating operations for generating output signals LO* and DTC* around a window or pre-determined number of time cycles or periods from the LO and the $DTC_0$.

As stated above, the detector component 103' can comprise a stochastic TDC, for example, that is configured to respond to one of the signals from the gating components 202 or 204, create a delay copy and then compare the delayed copy against the other signal (e.g. a previous signal or reference/original signal). For example, signal one, in this case the LO, is first delayed by the first delay component 220 of the delay line 208. The delayed versions are further generated by the additional delay components (e.g., delays/ buffers 119 to 0) along the delay line 208. The delayed versions are captured by the flip-flops 210a thru 210x, which can be banks or groups of a plurality of flip-flops or a single flip flop. An advantage of having a plurality of flip-flops at each group of flip-flops 210a to 210x is that a voting scheme or statistical distribution or mapping can be generated in order to eliminate any manufacturing tolerances or false-positives that could result, such as by generating a one bit where a zero bit should indicate an absence or opposite indication of a delayed signal, for example, of the LO. Once these delayed versions are generated via the delay line 208, the flip-flops 210a-210x sample the other signal using the delayed versions. The flip-flops, for example, could generate a series of zeros then a series of ones, in which the zero to one transition can indicate or trigger when the rising edge occurs. The TDC 103' thus provides a DTC quantizing or quantization as the time difference between the DTC and the LO. The LO outputs at the other end of the delay line, and the counts or comparisons can be sustained for a certain number of cycles (window). After a pre-determined number of delay line cycles, the operation is complete or terminated once all the delayed versions have been generated and sampled in the flip-flops 210a-210x.

In another embodiment, the decoder 212 receives all data collected from the TDC 103' in a pipelined connection 218, such as via a serial connection or pathway bus. The delayed LO versions can then be post-processed in the pipelined decoder 212. Taking the raw data from 218, the pipeline decoder 212 post-processes the data and extracts the location of the edges for each clock cycle within the gating window. The pipelining allows the circuit to run at a high speed without requiring the complete decoding to be completed in a single clock cycle. The device 200 can then systematically determine the entire transmitter or wireless DTC response, which can be further demonstrated in conjunction with and in reference to FIG. 3.

Figure 3:
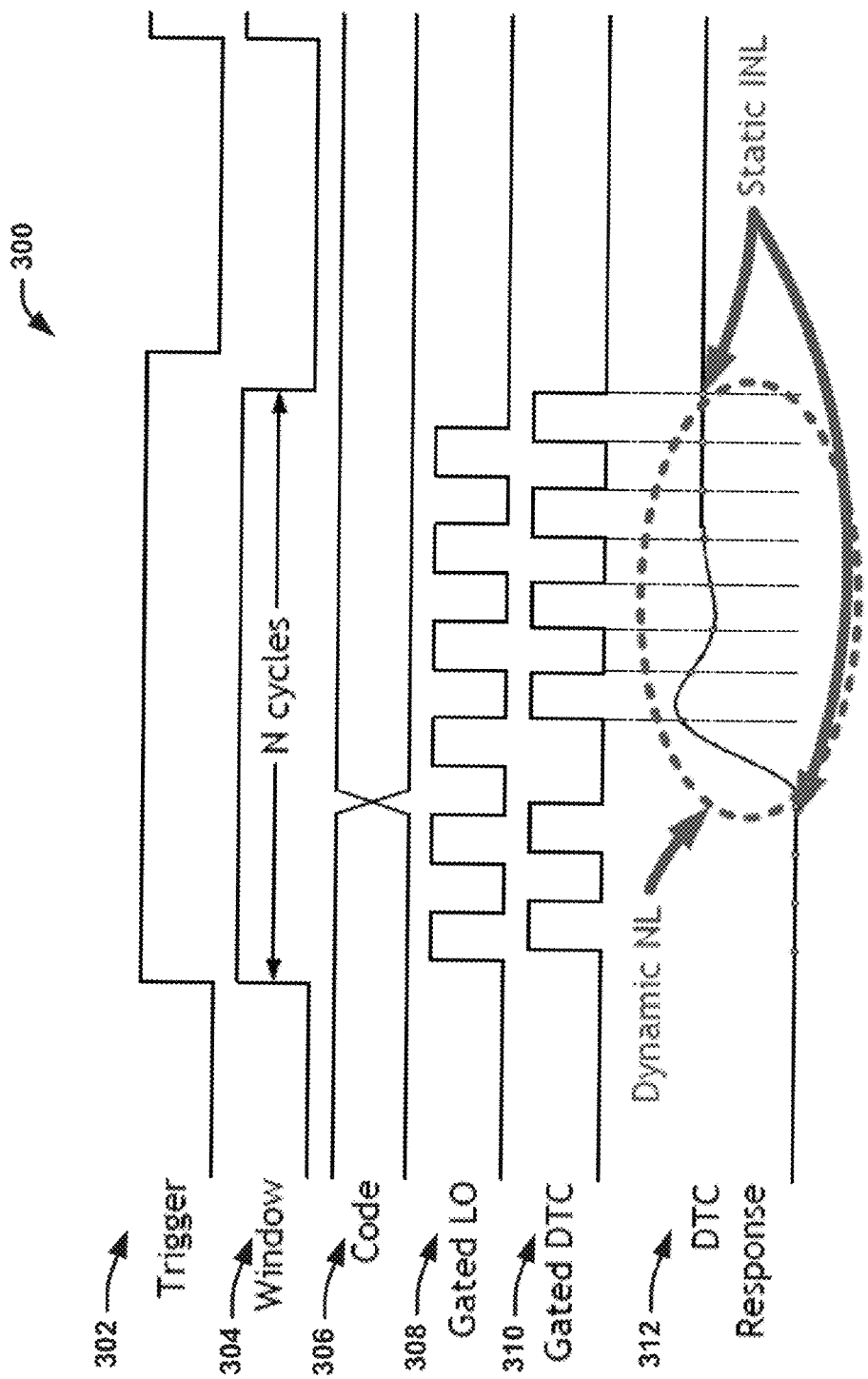
FIG. 3 is a diagram illustrating time sequences related to the calibration of a DTC static and dynamic errors according to various aspects described.

FIG. 3 illustrates signal patterns 300 for processes of the DTC calibration scheme illustrated in FIG. 2, for example. The sample signal patterns 300 such as the gated LO signal pattern 308 has about six LO edges (three rising and three falling) before settling into a steady state response, for example. If a code transition 306 is applied to the DTC (e.g., DTC 101), such as by the calibration and correction component 103, initially an overshoot can be observed in the signal response, as shown in the transient response 312, a little bit of an undershoot and then a settling into a steady state level as the new static INL value. The patterns demonstrate, as an example, that after three rising edges and three falling edges from the time of a code transition, the signal response becomes stable. Thus, a pre-determined number of N clock cycles (e.g., N=6 cycles, or a different number of cycles) around the code transition are used in order to capture the edges of the gated DTC 310 relative to the LO. This captures the transient in a window 304 in response to the trigger 302. This is only one example and is not limiting to any particular number, in which the number of edges for a window could be more or less.

Referring back to FIG. 2, the delay line 208 only captures on edge relative to the LO at a given time and each edge is stored. However, the edges are coming in quick succession, with little time in-between them, such as for cellular signals about a few hundred pico seconds apart, for example. As the TDC 103' captures the data, it is shifted forward into the pipeline decoder 212. Each time when a new sample is generated, the pipelined decoder 212 captures samples of it. Each stage of the pipelined decoder 212 then passes along its previous data or state that had been captured to the next stage of the pipeline so as to not lose the data, and receives a new state of these edges at a time, which is sufficient to completely characterize the dynamic error.

The pipeline decoder 212 receives time from the delay line 208 to initiate a start signal. Each of the array of flip-flops 210a-210x is tied directly to the delay line 208, which could be any number flips flops each depending on accuracy, power or other design parameters. Each of the arrays or banks of flip-flops 210a-210x is generating an output and at each time the LO signal reaches the end of delay line 208, the data (or captured states as each stage), then shifts into the decoder 212. The decoder 212 takes the data, extracts the rising edge and the rising edge location in a pipelined manner, because each time a new LO signal is coming through, it captures and passes it along to the next stages for further processing, for calibration or correction, for example.

The idea of having multiple flip-flops banks (210a-210x in FIG. 2) or arrays at each position or location is that using one flip flop to sample one clock against another you will get a zero or one relative to where the clocks (DTC or LO) are to one another, such as, for example, by using the LO to do the sampling, and the signal being sampled by the LO is the DTC output or vice versa.

Referring again to FIG. 3, in one example, the DTC edge of the gated DTC pattern 310 occurs initially after the LO rising edge of the gated LO pattern 308. When the LO signal 306 goes high as a rising edge and the flip flop samples the value a series of zeros could be captured. If the edges of the DTC and LO were reversed, the samples could get a bunch of ones. A single flip flop is a zero or one, but if you get a group of them in parallel, because of random variation, some of them would register a zero and others be coded as one, when the two edges are close enough (within the range of variation of the setup time of the flip-flops). Thus, by having a group or multiple flip-flops in parallel the result becomes a probabilistic scheme, where each of them has a slightly different setup time. The outputs of the flip-flops for each group can then be summed, and cross-referenced like a voting scheme, where each are voting as a zero or one, and by summing them up a better idea of what the real values are can be obtained in a statistical profile or measure, or a voting scheme, making it more precise.

The timing diagrams of the proposed scheme illustrated in FIG. 3. As demonstrates that the measurement can capture both static and dynamic errors, and therefore generate all the information required to calibrate the DTC 101. This approach does not compromise the metastability performance of the basic stochastic-flash TDC 103' despite the wave-pipelined implementation due to the gain from the multiple cascaded flip-flops and logic. Typical implementations of the DTC 101 also segment the high resolution between the multiple phases of a divider (coarse) and edge interpolators (fine) to optimize noise and power. With such implementations the DTC non-linearities show a periodic behavior, repeating with every step of the coarse DTC. Therefore the calibration TDC range can be reduced to span only the fine DTC delay.

Figure 4:
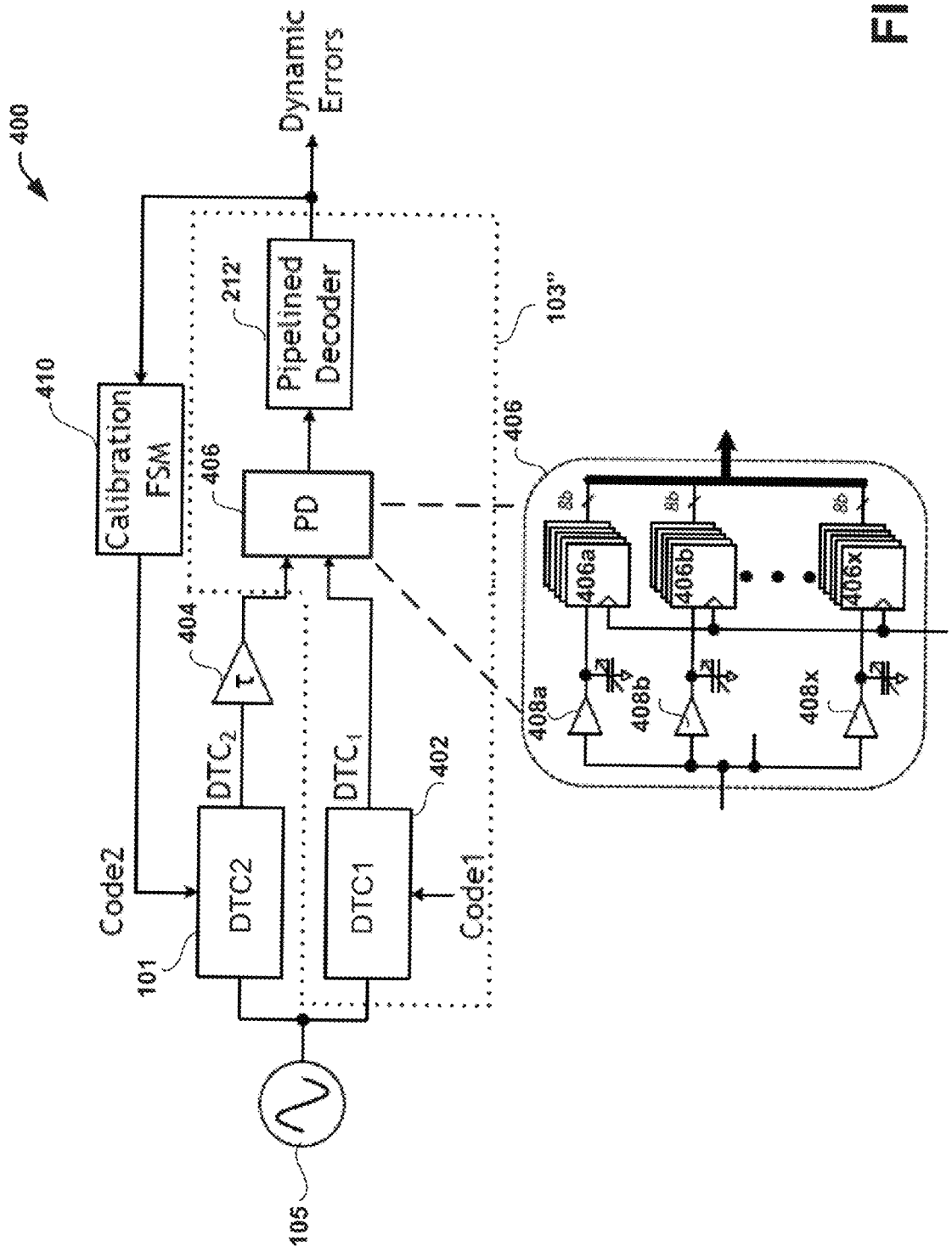
FIG. 4 is another a functional block diagram illustrating a wireless communication system or device with an example of an additional digital-to-time converter (DTC) in a calibration scheme architecture according to various aspects described.

Referring to FIG. 4, illustrated is a wireless system for calibrating a DTC of a wireless device in accordance with various aspects described herein. The system 400 uses an additional DTC 402 coupled together with DTC 101 to calibrate the static and dynamic nonlinearity of each DTC against the other. To measure the dynamic behavior and then calibrate the DTC (e.g., DTC 101), the DTC static INL is measured. In order to measure the dynamic error, the code transitions are applied sequentially to the two DTCs 101 and 402, each time allowing one DTC (e.g., DTC 101) to settle before applying the step to the other DTC (e.g., DTC 402). The codes applied to the DTCs 101 and 402 can be selected based on the static INL measurements to ensure that the DTC outputs (DTC$_1$, DTC$_2$) are close enough to be within the dynamic range of the phase detector 406. As with the static INL calibration, because each measurement is made against the other DTC, keeping its code a constant, any correlated noise sources in the second DTC can be high-pass filtered, which is similar to correlated double sampling. To eliminate the correlated noise from the DTC being measured, the extracted dynamic errors can be compared against the steady-state value that the DTC settles to.

The system 400 determines the transfer functions of the two DTCs. For example if DTC$_1$ has a transfer function of g(x), i.e. the outputs edge of the DTC is delayed from the input edge as a function of the applied digital code as g(code). Similarly if we assume that DTC$_2$ is described by the transfer function f(x), for example. The DTC 402 receives a digital code (Code 1) of $x_0$ and the DTC 101 receives a digital code (Code 2) of $y_0$. A measurement of the time delay between DTC 1 and DTC 2 is generated, and this measurement is output to a phase detector 406 (e.g., TDC), a representative example of which is detailed in the blow-up view. Once the measurement of the time delay 404 is delivered to the phase detector 406, the other the DTC (e.g., DTC$_2$) is incremented by the digital code it receives to $y_{0+1}$, while the first DTC$_1$ is kept at the same code of $x_0$. Then, a new comparison or measurement is determined by the phase detector. Between each measurement, one of the two DTCs can be held to the previous code. The two measurements can be subtracted and generate the magnitude of the steps or intervals of a DTC as the baseline/previous measurement being held constant drops out in the measurement calculation. The result of the measurements enables the system 400 to suppress any correlated noise sources such as flicker noise, offsets, drifts from PVT changes, etc. Consequently, the non-linearity (e.g., the static non-linearity, or static INL) can be accurately measured by the averaging the difference of measurements.

The phase detector 406 comprises similar elements as the TDC of detector component 103' in FIG. 2. Delay components 408a thru 408x are at different locations having different varactors corresponding thereto for different fields. Groups of flip-flops 406a thru 406x are also similar in function to the flips flops 210a thru 210x of FIG. 2. It is to be noted that no particular phase detector topology is limited to the present disclosure and any phase detector topology with sufficient range and resolution can be used.

In one example, the operations for measuring static INL or dynamic non-linearity can comprise open loop correlated double sampling. The two DTCs 101 and 402 can be controlled by the calibration finite state machine (FSM) 410, which increments each DTC 101, 402 independently at a time. For example, for determining static INL initially DTC$_1$ can be code $X_0$ and DTC$_2$ is on code $Y_0$. For example, assuming again that the DTCs 101 and 402 are given by the transfer functions f(·) and g(·) respectively, then the phase detector 406 (e.g., a TDC) measures the time difference at the output given by $$\tau_{00} = g(X_0) - f(Y_0)$$

Now, calibration FSM 410 (e.g., a component of the calibration and correction component 102 of FIG. 1) can increment DTC$_2$ to code $Y_1$ (e.g., $Y_1 = Y_{0+1}$). The TDC 406 can then measure:

$$\tau_{01} = g(X_0) - f(Y_1)$$

Then, the system 400 can increment DTC$_1$ to code $X_1$ (e.g., $X_1 = X_{0+1}$). The new measurement can be given by:

$$\tau_{11} = g(X_1) - f(Y_1)$$

If the differences of the measurements are observed, it can be seen that the magnitude of the delay step is extracted around the codes $X_0$ and $Y_0$, which can be the dynamic non-linearity of the DTC:

$$\tau_{00} - \tau_{01} = f(Y_1) - f(Y_0)$$

$$\tau_{11} - \tau_{01} = g(X_1) - g(X_0)$$

This sequence of alternately incrementing the two different DTCs 101 and 402 can be then repeated to cover the entire code range (e.g., of 360 degrees phase or the like).

Figure 5:
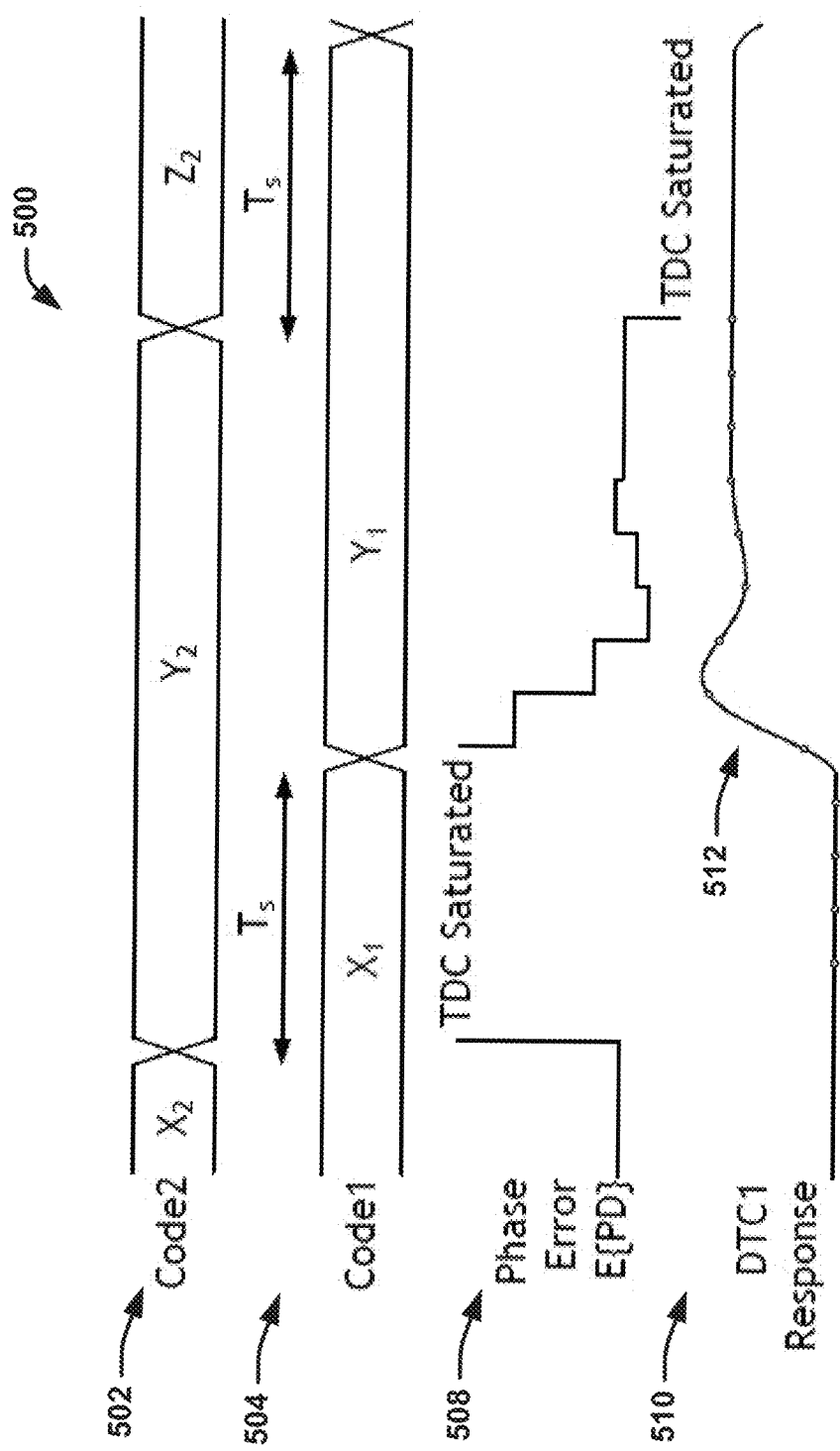
FIG. 5 is another diagram illustrating time sequences related to the calibration of a DTC according to various aspects described.

The processes or operations described above can be utilized to determine static INL and also further used to then measure dynamic errors for arbitrary step sizes, or, in other words, step sizes in code that are different from one another or different from the above processes for determining static INL. For example, the control and timing sequence diagrams 500 of the system 400 is illustrated in FIG. 5. In response to incrementing the digital codes alternatingly and one at a time, the magnitudes of the delay step for each DTC, DTC1 402, DTC 2 101 are extracted. With this data, the system 400 at the pipelined detector component 103" is able to construct the transfer function of each DTC 101, 402. This enables the system 400 to determine and apply the particular digital code on one DTC and predict what to apply on the other DTC to have the two edges aligned.

For example, in the timing diagrams 500 of FIG. 5, the timing diagram 504 is initially DTC1 402 as code $X_1$ and the timing diagram 502 is initially DTC2 101 as $X_2$. The DTCs could have been chosen in a way that the outputs are aligned so the DTCs 101 and 402 can operate within a similar range that the phase detector 406 (e.g., a TDC or other architecture) operates. If there is a large error, the phase detector 406 would saturate, as shown in the phase error sequence 508 at "TDC Saturated". In order to measure the dynamic errors of the DTC1 402 response 510, for example, a step or increment is applied to one of the DTCs and the output response 510 is captured to determine the non-linear behaviors as the transient response 512, and likewise with the other DTC2 101, for example. If the system 400 wants to capture the dynamic response on DTC1 402 when an increment or a step is applied, where the desired/design step is from $X_1$ to $Y_1$, or other arbitrary step, the system 400 knows that DTC2 101, code $X_2$ is close to the output of DTC$_1$ as driven by $X_1$. Similarly, if DTC1 402 is driven by $Y_1$ then a code of $Y_2$ is applied on DTC2 101. These can be determined from the static non-linearity calculations as well based on a reference value and an actual value or incremented values.

In order to measure the jump from $X_1$ to $Y_1$, first a pre-charge can be performed on DTC2 101 to y2. Otherwise the jump from $X_1$ to $Y_1$ could cause the phase detector 406 or TDC to actually have a phase difference that is very large. Thus, the DTC2 101 is incremented to the desired target value of $Y_2$, and allowed to settle. Because the dynamic errors are measured from large code jumps, the difference between the two DTC outputs ($DTC_1$, $DTC_2$) could be outside the dynamic range of the TDC or phase detector 406, resulting in a saturated output. Once DTC2 101 has settled, the desired code jump is applied to DTC1 402. As it settles the $DTC_1$ output is shown in the timing diagram 508, called DTC1 response, which illustrates some ripple and then settling to the steady state delay. The TDC 406 started out being saturated in this example, but as DTC1 settles, the difference in the edges between the two DTCs is now within its dynamic range. So the detector 103" can determine how the DTC is settling and capture this data. Samples of the $DTC_1$, for example, can thus be captured by using the $DTC_2$ to initially go close to the final value so when $DTC_1$ makes the transition the detector component 103" can actually capture the value.

As such, increments between any code and another digital code can be characterized (via the distortion correction component 104, or other component) by dynamic errors or memory errors, as well as static errors. The magnitude of these dynamic errors can be measured for different starting codes in order to collect the data and build a table to be referenced by the wireless device. The distortion correction component 104 thus can extract a noise or dynamic from the first DTC or the second DTC based on the differences determined and a comparison of the differences with a steady-state response of the first DTC or the second DTC depending on which DTC is targeted for calibration or correction. The distortion correction component 104 of FIG. 1, for example, or another component can be configured to generate a transient response table comprising increment codes for incrementing the digital code based on a transient response of the first DTC from the dynamic behavior of the code transition. The correction facilitated by the calibration and correction component 102 can then use any memory based pre-distortion algorithm as one of ordinary skill in the art would appreciate.

Some advantages of this architecture over other existing solutions include saving area and power, simplifying the phase detector circuit, and suppressing correlated noise and error sources such as flicker noise. In a system with more than one DTC (carrier aggregation/channel bonding and MIMO), the calibration scheme requires minimal additional hardware.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
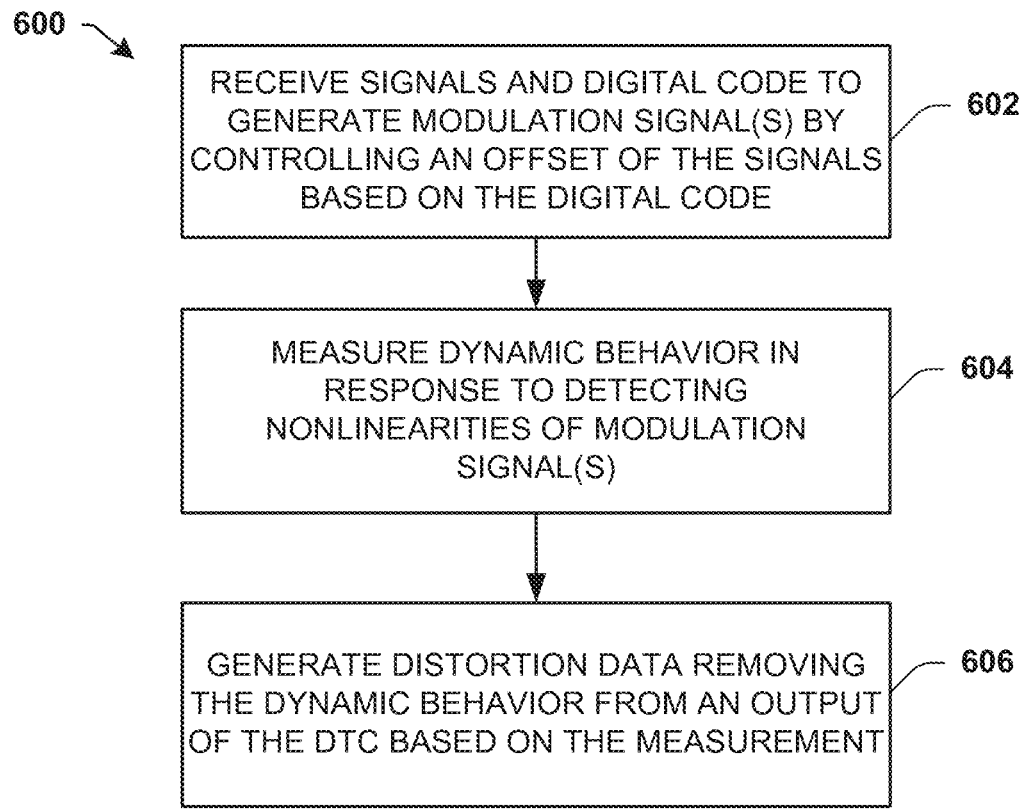
FIG. 6 is an example flow diagram illustrating a method for a wireless communication system or device to calibrate or correct a DTC according to various aspects described.

Referring to FIG. 6, illustrated is a method 600 for the calibration of a DTC. The method initiates at 602 with receiving, via the DTC 101, one or more signals and a digital code to generate one or more modulation signals by controlling an offset of the one or more signals based on the digital code.

At 604, a measurement (e.g., via the detection component 103) of a dynamic behavior is generated in response to detecting nonlinearities of the modulation signal. This can include measuring a time varying error during a transition of the digital code to another digital code. The dynamic behavior, for example, can also by determining a transient response of the DTC based on a transition in the output of the DTC in response to receiving the digital code and subsequently a different digital code. A pre-determined number of clock cycles or a window can be pre-determined around a code transition of the digital code to a different digital code, and the edges or behavior within the window measured, for example. The dynamic behavior of the DTC can thus be modelled with the plurality of differences by generating a transient response function within a number of predetermined clock cycles. Subsequently, noise can be eliminated or reduced from the DTC based on a comparison of the differences to a steady state response of the DTC.

At 606, distortion data is provided (e.g., via the distortion correction component 104) that removes the dynamic behavior from an output of the DTC based on the measurement.

Additionally or alternatively, the detection component 103 can determine a code dependent static error based on a reference value and a steady-state value.

In one embodiment, the method can include alternately receiving, via the DTC and one other DTC, at a plurality of cycles, a current digital code that is incremented from a previously received digital code, respectively. A plurality of differences of outputs can be generated based on the previous digital code of the DTC or the one other DTC and the current digital code of the DTC or the one other DTC that did not receive the previous digital code.

In another embodiment, a transient response table can be generated that comprises increment codes for incrementing the digital code based on a transient response of the DTC based on the dynamic behavior from a code transition. Noise or non-linearity can further be eliminated or reduced from the DTC based on the known transient response.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Figure 7:
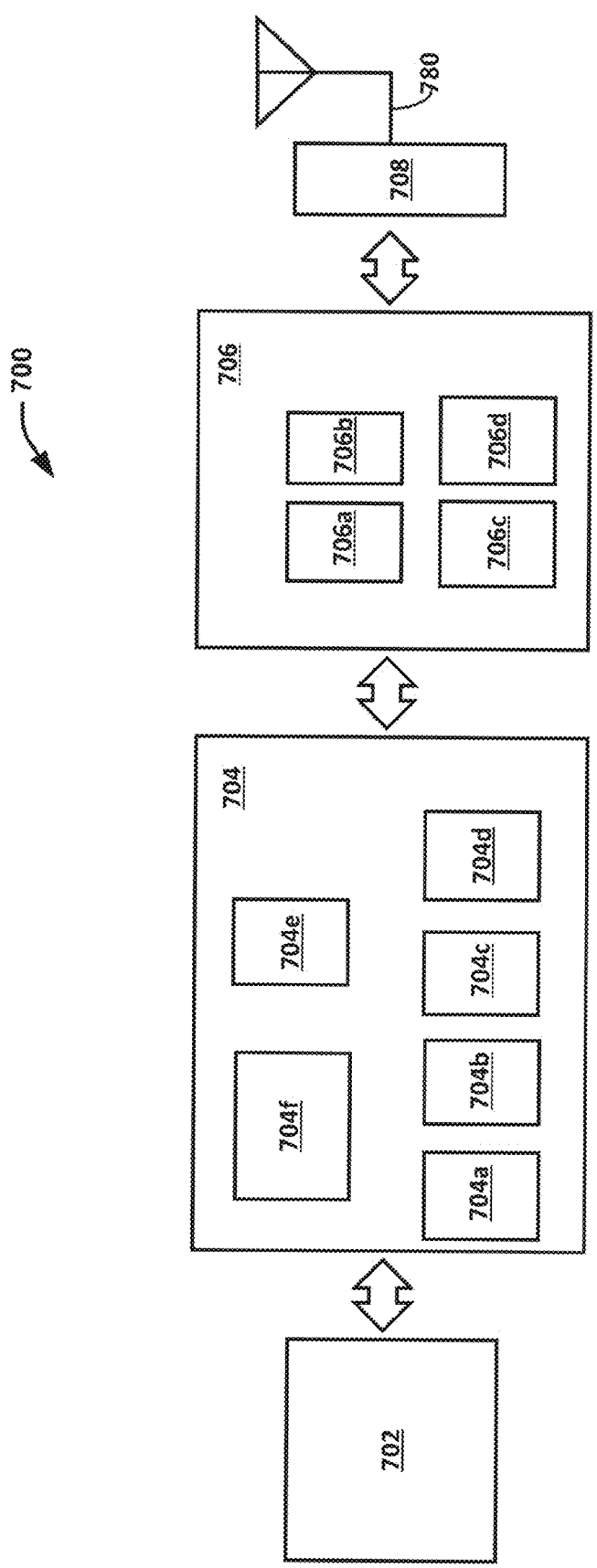
FIG. 7 is an example communication system environment for implementing one or more embodiments being disclosed.

Embodiments described herein can be implemented into a system using any suitably configured hardware and/or software. FIG. 7 illustrates, for one embodiment, example components of a User Equipment (UE) device 700. In some embodiments, the UE device 700 (e.g., the wireless communication device 101) can include application circuitry 702, baseband circuitry 704, Radio Frequency (RF) circuitry 706, front-end module (FEM) circuitry 708 and one or more antennas 780, coupled together at least as shown.

The application circuitry 702 can include one or more application processors. For example, the application circuitry 702 can include circuitry such as, but not limited to, one or more single-core or multi-core processors. The processor(s) can include any combination of general-purpose processors and dedicated processors (e.g., graphics processors, application processors, etc.). The processors can be coupled with and/or can include memory/storage and can be configured to execute instructions stored in the memory/storage to enable various applications and/or operating systems to run on the system.

The baseband circuitry 704 can include circuitry such as, but not limited to, one or more single-core or multi-core processors. The baseband circuitry 704 can include one or more baseband processors and/or control logic to process baseband signals received from a receive signal path of the RF circuitry 706 and to generate baseband signals for a transmit signal path of the RF circuitry 706. Baseband processing circuitry 704 can interface with the application circuitry 702 for generation and processing of the baseband signals and for controlling operations of the RF circuitry 706. For example, in some embodiments, the baseband circuitry 704 can include a second generation (2G) baseband processor 704a, third generation (3G) baseband processor 704b, fourth generation (4G) baseband processor 704c, and/or other baseband processor(s) 704d for other existing generations, generations in development or to be developed in the future (e.g., fifth generation (5G), 6G, etc.). The baseband circuitry 704 (e.g., one or more of baseband processors 704a-d) can handle various radio control functions that enable communication with one or more radio networks via the RF circuitry 706. The radio control functions can include, but are not limited to, signal modulation/demodulation, encoding/decoding, radio frequency shifting, etc. In some embodiments, modulation/demodulation circuitry of the baseband circuitry 704 can include Fast-Fourier Transform (FFT), precoding, and/or constellation mapping/demapping functionality. In some embodiments, encoding/decoding circuitry of the baseband circuitry 704 can include convolution, tail-biting convolution, turbo, Viterbi, and/or Low Density Parity Check (LDPC) encoder/decoder functionality. Embodiments of modulation/demodulation and encoder/decoder functionality are not limited to these examples and can include other suitable functionality in other embodiments.

In some embodiments, the baseband circuitry 704 can include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 704e of the baseband circuitry 704 can be configured to run elements of the protocol stack for signaling of the PHY, MAC, RLC, PDCP and/or RRC layers. In some embodiments, the baseband circuitry can include one or more audio digital signal processor(s) (DSP) 704f. The audio DSP(s) 704f can be include elements for compression/decompression and echo cancellation and can include other suitable processing elements in other embodiments. Components of the baseband circuitry can be suitably combined in a single chip, a single chipset, or disposed on a same circuit board in some embodiments. In some embodiments, some or all of the constituent components of the baseband circuitry 704 and the application circuitry 702 can be implemented together such as, for example, on a system on a chip (SOC).

In some embodiments, the baseband circuitry 704 can provide for communication compatible with one or more radio technologies. For example, in some embodiments, the baseband circuitry 704 can support communication with an evolved universal terrestrial radio access network (EU-TRAN) and/or other wireless metropolitan area networks (WMAN), a wireless local area network (WLAN), a wireless personal area network (WPAN). Embodiments in which the baseband circuitry 704 is configured to support radio communications of more than one wireless protocol can be referred to as multi-mode baseband circuitry.

RF circuitry 706 can enable communication with wireless networks using modulated electromagnetic radiation through a non-solid medium. In various embodiments, the RF circuitry 706 can include switches, filters, amplifiers, etc. to facilitate the communication with the wireless network. RF circuitry 706 can include a receive signal path which can include circuitry to down-convert RF signals received from the FEM circuitry 708 and provide baseband signals to the baseband circuitry 704. RF circuitry 706 can also include a transmit signal path which can include circuitry to up-convert baseband signals provided by the baseband circuitry 704 and provide RF output signals to the FEM circuitry 708 for transmission.

In some embodiments, the RF circuitry 706 can include a receive signal path and a transmit signal path. The receive signal path of the RF circuitry 706 can include mixer circuitry 706a, amplifier circuitry 706b and filter circuitry 706c. The transmit signal path of the RF circuitry 706 can include filter circuitry 706c and mixer circuitry 706a. RF circuitry 706 can also include synthesizer circuitry 706d for synthesizing a frequency for use by the mixer circuitry 706a of the receive signal path and the transmit signal path. In some embodiments, the mixer circuitry 706a of the receive signal path can be configured to down-convert RF signals received from the FEM circuitry 708 based on the synthesized frequency provided by synthesizer circuitry 706d. The amplifier circuitry 706b can be configured to amplify the down-converted signals and the filter circuitry 706c can be a low-pass filter (LPF) or band-pass filter (BPF) configured to remove unwanted signals from the down-converted signals to generate output baseband signals. Output baseband signals can be provided to the baseband circuitry 704 for further processing. In some embodiments, the output baseband signals can be zero-frequency baseband signals, although this is not a requirement. In some embodiments, mixer circuitry 706a of the receive signal path can comprise passive mixers, although the scope of the embodiments is not limited in this respect.

In some embodiments, the mixer circuitry 706a of the transmit signal path can be configured to up-convert input baseband signals based on the synthesized frequency provided by the synthesizer circuitry 706d to generate RF output signals for the FEM circuitry 708. The baseband signals can be provided by the baseband circuitry 704 and can be filtered by filter circuitry 706c. The filter circuitry 706c can include a low-pass filter (LPF), although the scope of the embodiments is not limited in this respect.

In some embodiments, the mixer circuitry 706a of the receive signal path and the mixer circuitry 706a of the transmit signal path can include two or more mixers and can be arranged for quadrature downconversion and/or upconversion respectively. In some embodiments, the mixer circuitry 706a of the receive signal path and the mixer circuitry 706a of the transmit signal path can include two or more mixers and can be arranged for image rejection (e.g., Hartley image rejection). In some embodiments, the mixer circuitry 706a of the receive signal path and the mixer circuitry 706a can be arranged for direct downconversion and/or direct upconversion, respectively. In some embodiments, the mixer circuitry 706a of the receive signal path and the mixer circuitry 706*a* of the transmit signal path can be configured for super-heterodyne operation.

In some embodiments, the output baseband signals and the input baseband signals can be analog baseband signals, although the scope of the embodiments is not limited in this respect. In some alternate embodiments, the output baseband signals and the input baseband signals can be digital baseband signals. In these alternate embodiments, the RF circuitry 706 can include analog-to-digital converter (ADC) and digital-to-analog converter (DAC) circuitry and the baseband circuitry 704 can include a digital baseband interface to communicate with the RF circuitry 706.

In some dual-mode embodiments, a separate radio IC circuitry can be provided for processing signals for each spectrum, although the scope of the embodiments is not limited in this respect.

In some embodiments, the synthesizer circuitry 706*d* can be a fractional-N synthesizer or a fractional N/N+8 synthesizer, although the scope of the embodiments is not limited in this respect as other types of frequency synthesizers can be suitable. For example, synthesizer circuitry 706*d* can be a delta-sigma synthesizer, a frequency multiplier, or a synthesizer comprising a phase-locked loop with a frequency divider.

The synthesizer circuitry 706*d* can be configured to synthesize an output frequency for use by the mixer circuitry 706*a* of the RF circuitry 706 based on a frequency input and a divider control input. In some embodiments, the synthesizer circuitry 706*d* can be a fractional N/N+8 synthesizer.

In some embodiments, frequency input can be provided by a voltage controlled oscillator (VCO), although that is not a requirement. Divider control input can be provided by either the baseband circuitry 704 or the applications processor 702 depending on the desired output frequency. In some embodiments, a divider control input (e.g., N) can be determined from a look-up table based on a channel indicated by the applications processor 702.

Synthesizer circuitry 706*d* of the RF circuitry 706 can include a divider, a delay-locked loop (DLL), a multiplexer and a phase accumulator. In some embodiments, the divider can be a dual modulus divider (DMD) and the phase accumulator can be a digital phase accumulator (DPA). In some embodiments, the DMD can be configured to divide the input signal by either N or N+8 (e.g., based on a carry out) to provide a fractional division ratio. In some example embodiments, the DLL can include a set of cascaded, tunable, delay elements, a phase detector, a charge pump and a D-type flip-flop. In these embodiments, the delay elements can be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 706*d* can be configured to generate a carrier frequency as the output frequency, while in other embodiments, the output frequency can be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency can be a LO frequency ($f_{LO}$). In some embodiments, the RF circuitry 706 can include an IQ/polar converter.

FEM circuitry 708 can include a receive signal path which can include circuitry configured to operate on RF signals received from one or more antennas 780, amplify the received signals and provide the amplified versions of the received signals to the RF circuitry 706 for further processing. FEM circuitry 708 can also include a transmit signal path which can include circuitry configured to amplify signals for transmission provided by the RF circuitry 706 for transmission by one or more of the one or more antennas 780.

In some embodiments, the FEM circuitry 708 can include a TX/RX switch to switch between transmit mode and receive mode operation. The FEM circuitry can include a receive signal path and a transmit signal path. The receive signal path of the FEM circuitry can include a low-noise amplifier (LNA) to amplify received RF signals and provide the amplified received RF signals as an output (e.g., to the RF circuitry 706). The transmit signal path of the FEM circuitry 708 can include a power amplifier (PA) to amplify input RF signals (e.g., provided by RF circuitry 706), and one or more filters to generate RF signals for subsequent transmission (e.g., by one or more of the one or more antennas 780.

In some embodiments, the UE device 700 can include additional elements such as, for example, memory/storage, display, camera, sensor, and/or input/output (I/O) interface.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a wireless system comprising a digital-to-time converter (DTC) configured to receive one or more signals and a digital code, and generate a modulation signal for a wireless signal by controlling an offset of the one or more signals based on the digital code. A detector component is configured to receive the modulation signal and detect nonlinearities of the DTC, and generate a measurement of one or more properties of a dynamic error associated with the nonlinearities. A distortion correction component is configured to generate one or more distortion data that reduces the nonlinearities of the DTC based on the measurement.

Example 2 is a wireless system including the subject matter of example 1, wherein the detector comprises a time-to-digital converter (TDC), or an additional DTC, coupled to the DTC, configured to measure the one or more properties of the dynamic error by measuring a time-varying error during a transition from the digital code to another digital code.

Example 3 is a wireless system including the subject matter of examples 1-2, including or omitting any elements, wherein the detector comprises a static component configured to determine a code dependent static error based on a reference value and an actual value; and a dynamic component configured to determine a transient response of the DTC from a transition of the digital code to another digital code.

Example 4 is a wireless system including the subject matter of examples 1-3, including or omitting any elements, further comprising: a segment component configured to set a pre-determined number of clock cycles around a code transition of the digital code to another digital code; and a dynamic component configured to determine the one or more properties of the dynamic error based on a transient response of the DTC from a transition of the digital code to another digital code within the pre-determined number of clock cycles.

Example 5 is a wireless system including the subject matter of examples 1-4, including or omitting any elements, wherein the detector comprises a TDC comprising: a coarse tuning component configured to generate a coarse quantitating offset of a time delay or a phase offset of the one or more signals; and a fine tuning component, coupled to the coarse tuning component, configured to receive the coarse quantitating offset, and generate a fine quantitating offset of the time delay or the phase offset of the one or more signals based on the distortion data.

Example 6 is a wireless system including the subject matter of examples 1-5, including or omitting any elements, wherein the detector is further configured to generate a spatial averaging and a time-domain weighted averaging of multiple measurements about a transition of the digital code to another digital code.

Example 7 is a wireless system including the subject matter of examples 1-6, including or omitting any elements, wherein the detector is further configured to facilitate a reduction in a quantization noise to a level that is less than a quantization step of the DTC.

Example 8 is a wireless system including the subject matter of examples 1-7, including or omitting any elements, wherein the detector comprises an additional DTC, coupled to the DTC, wherein the additional DTC and the DTC are configured to alternatingly receive a sequence of digital codes between one another, and after a previous output of the additional DTC, or of the DTC, receiving at least one previous digital code of the sequence of digital codes settles to a steady-state response.

Example 9 is a wireless system including the subject matter of examples 1-8, including or omitting any elements, wherein the detector is further configured to determine the one or more properties of the dynamic error based on a transient response of the DTC, or the additional DTC, by generating a comparison of the previous output of the DTC and a current output of the additional DTC receiving an incremented digital code, and another comparison of another previous output of the additional DTC and another current output of the DTC receiving the incremented digital code.

Example 10 is a wireless device comprising: a first digital-to-time converter (DTC) configured to receive one or more signals and a digital code, and generate a modulation signal for a wireless signal by controlling an offset of the one or more signals based on the digital code; a detector component, coupled to the first DTC, configured to receive the modulation signal and generate a measurement of one or more properties of a non-linearity of the modulation signal comprising a dynamic behavior of a code transition; and a distortion correction component configured to generate a set of distortion data that mitigates or reduces the non-linearity of the DTC based on the measurement of the one or more properties of the non-linearity.

Example 11 is a wireless device including the subject matter of example 10, including or omitting any elements, wherein the one or more properties comprises a dynamic error generated from a transition between receiving the digital code to receiving another digital code, and a static error based on a reference value and a current steady state value of the modulation signal.

Example 12 is a wireless device including the subject matter of examples 10-11, including or omitting any elements, wherein the detector component comprises a time-to-digital converter (TDC) comprising: a coarse tuning component configured to generate a coarse quantitating offset of the modulation signal; and a fine tuning component, coupled to the coarse tuning component, configured to receive the coarse quantitating offset, and generate a fine quantitating offset of the modulation signal based on an output of the DTC and a local oscillator signal propagated through a delay line and captured in a wave-pipelined process via a plurality of flip-flop banks located at different locations along the delay line.

Example 13 is a wireless device including the subject matter of examples 10-12, including or omitting any elements, further comprising a decoder, coupled to the delay line and the plurality of flip-flop banks of the TDC, configured to post-process data from the TDC by extracting an edge location.

Example 14 is a wireless device including the subject matter of examples 10-13, including or omitting any elements, wherein the distortion correction component comprises a calibration and correction component configured to generate the set of distortion data that eliminates the dynamic behavior within a code transition of the DTC based on the edge location.

Example 15 is a wireless device including the subject matter of examples 10-14, including or omitting any elements, wherein the detector comprises: a second DTC coupled to the first DTC, wherein the first DTC and the second DTC are configured to alternately receive an incremented digital code and generate a first output and a second output in response to the incremented digital code; and a TDC coupled to the first DTC via a first connection and to the second DTC via a second connection, configured to receive the first output based on the incremented digital code and the second output based on a previous digital code that has not been incremented, and generate a difference of outputs of the first DTC and the second DTC.

Example 16 is a wireless device including the subject matter of examples 10-15, including or omitting any elements, wherein the distortion correction component extracts a noise from the first DTC or the second DTC based on the difference and a comparison of the difference with a steady-state response of the first DTC or the second DTC.

Example 17 is a wireless device including the subject matter of examples 10-16, including or omitting any elements, wherein the detector is further configured to determine a transient response of the first DTC, or the second DTC, from a comparison of the difference with a steady state response of the first DTC or the second DTC.

Example 18 is a wireless device including the subject matter of examples 10-17, including or omitting any elements, wherein the distortion correction component is further configured to generate a transient response table comprising increment codes for incrementing the digital code based on a transient response of the first DTC from the dynamic behavior of the code transition.

Example 19 is a method for a calibration of a digital-to-time converter (DTC) comprising: receiving, via the DTC, one or more signals and a digital code to generate a modulation signal by controlling an offset of the one or more signals based on the digital code; measuring of a dynamic behavior in response to detecting nonlinearities of the modulation signal; and generate a set of distortion data that removes the dynamic behavior from an output of the DTC based on the measured dynamic behaviour.

Example 20 is a method including the subject matter of example 19, including or omitting any elements, including or omitting any elements, further comprising: measuring a time varying error during a transition of the digital code to another digital code.

Example 21 is a method including the subject matter of examples 19-20, including or omitting any elements, further comprising: determining a code dependent static error based on a reference value and a steady-state value; and determining the dynamic behavior by determining a transient response of the DTC based on a transition in the output of the DTC in response to receiving the digital code and subsequently a different digital code.

Example 22 is a method including the subject matter of examples 19-21, including or omitting any elements, further comprising: setting a pre-determined number of clock cycles about a code transition of the digital code to a different digital code.

Example 23 is a method including the subject matter of examples 19-22, including or omitting any elements, further comprising: alternately receiving, via one of the DTC or another DTC, at a plurality of cycles, a current digital code that is incremented from a previously received digital code, respectively, while keeping an input of one of the DTC or the another DTC at a constant code; and generating a plurality of differences based on the previous digital code of the DTC or of the another DTC, and the current digital code of the DTC or of the another DTC that did not receive the previous digital code.

Example 24 is a method including the subject matter of examples 19-23, including or omitting any elements, further comprising modelling the dynamic behavior with the plurality of differences by generating a transient response function within a number of predetermined clock cycles; and eliminating noise from the DTC based on a comparison of the differences to a steady state response of the DTC.

Example 25 is a method including the subject matter of examples 19-24, including or omitting any elements, further comprising: generating a transient response table comprising increment codes for incrementing the digital code based on a transient response of the DTC based on the dynamic behavior from a code transition.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A wireless system comprising:
   a digital-to-time converter (DTC) configured to receive one or more signals and a digital code, and generate a modulation signal for a wireless signal by controlling an offset of the one or more signals based on the digital code;
   a detector component configured to receive the modulation signal and detect nonlinearities of the DTC, and generate a measurement of one or more properties of a dynamic error associated with the nonlinearities; and
   a distortion correction component configured to generate one or more distortion data that reduces the nonlinearities of the DTC based on the measurement;
   wherein the detector comprises a time-to-digital converter (TDC) TDC comprising:
   a coarse tuning component configured to generate a coarse quantitating offset of a time delay or a phase offset of the one or more signals; and
   a fine tuning component, coupled to the coarse tuning component, configured to receive the coarse quantitating offset, and generate a fine quantitating offset of the time delay or the phase offset of the one or more signals based on the distortion data.

2. The wireless system of claim 1, wherein the detector comprises a time-to-digital converter (TDC), or an additional DTC, coupled to the DTC, configured to measure the one or more properties of the dynamic error by measuring a time-varying error during a transition from the digital code to another digital code.

3. The wireless system of claim 1, wherein the detector comprises:
   a static component configured to determine a code dependent static error based on a reference value and an actual value; and
   a dynamic component configured to determine a transient response of the DTC from a transition of the digital code to another digital code.

4. The wireless system of claim 1, further comprising:
   a segment component configured to set a pre-determined number of clock cycles around a code transition of the digital code to another digital code; and
   a dynamic component configured to determine the one or more properties of the dynamic error based on a transient response of the DTC from a transition of the digital code to another digital code within the pre-determined number of clock cycles.

5. The wireless system of claim 1, wherein the detector is further configured to generate a spatial averaging and a time-domain weighted averaging of multiple measurements about a transition of the digital code to another digital code.

6. The wireless system of claim 5, wherein the detector is further configured to facilitate a reduction in a quantization noise to a level that is less than a quantization step of the DTC.

7. The wireless system of claim 1, wherein the detector comprises an additional DTC, coupled to the DTC, wherein the additional DTC and the DTC are configured to alternatingly receive a sequence of digital codes between one another, and after a previous output of the additional DTC, or of the DTC, receiving at least one previous digital code of the sequence of digital codes settles to a steady-state response.

8. The wireless system of claim 7, wherein the detector is further configured to determine the one or more properties of the dynamic error based on a transient response of the DTC, or the additional DTC, by generating a comparison of the previous output of the DTC and a current output of the additional DTC receiving an incremented digital code, and another comparison of another previous output of the additional DTC and another current output of the DTC receiving the incremented digital code.

9. A wireless device comprising:
a first digital-to-time converter (DTC) configured to receive one or more signals and a digital code, and generate a modulation signal for a wireless signal by controlling an offset of the one or more signals based on the digital code;
a detector component, coupled to the first DTC, configured to receive the modulation signal and generate a measurement of one or more properties of a non-linearity of the modulation signal comprising a dynamic behavior of a code transition, wherein the one or more properties comprises a dynamic error generated from a code transition between the digital code to another digital code, and a static error based on a reference value and a current steady state value of the modulation signal; and
a distortion correction component configured to generate a set of distortion data that mitigates or reduces the non-linearity of the DTC based on the measurement of the one or more properties of the non-linearity.

10. The wireless device of claim 9, wherein the detector component comprises a time-to-digital converter (TDC) comprising:
a coarse tuning component configured to generate a coarse quantitating offset of the modulation signal; and
a fine tuning component, coupled to the coarse tuning component, configured to receive the coarse quantitating offset, and generate a fine quantitating offset of the modulation signal based on an output of the DTC and a local oscillator signal propagated through a delay line and captured in a wave-pipelined process via a plurality of flip-flop banks located at different locations along the delay line.

11. The wireless device of claim 10, further comprising:
a decoder, coupled to the delay line and the plurality of flip-flop banks of the TDC, configured to post-process data from the TDC by extracting an edge location.

12. The wireless device of claim 11, wherein the distortion correction component comprises a calibration and correction component configured to generate the set of distortion data that eliminates the dynamic behavior within a code transition of the DTC based on the edge location.

13. The wireless device of claim 9, wherein the detector comprises:
a second DTC coupled to the first DTC, wherein the first DTC and the second DTC are configured to alternately receive an incremented digital code and generate a first output and a second output in response to the incremented digital code; and
a TDC coupled to the first DTC via a first connection and to the second DTC via a second connection, configured to receive the first output based on the incremented digital code and the second output based on a previous digital code that has not been incremented, and generate a difference of outputs of the first DTC and the second DTC.

14. The wireless device of claim 13, wherein the distortion correction component extracts a noise from the first DTC or the second DTC based on the difference and a comparison of the difference with a steady-state response of the first DTC or the second DTC.

15. The wireless device of claim 13, wherein the detector is further configured to determine a transient response of the first DTC, or the second DTC, from a comparison of the difference with a steady state response of the first DTC or the second DTC.

16. The wireless device of claim 9, wherein the distortion correction component is further configured to generate a transient response table comprising increment codes for incrementing the digital code based on a transient response of the first DTC from the dynamic behavior of the code transition.

17. A method for a calibration of a digital-to-time converter (DTC) comprising:
receiving, via the DTC, one or more signals and a digital code to generate a modulation signal by controlling an offset of the one or more signals based on the digital code;
measuring of a dynamic behavior in response to detecting nonlinearities of the modulation signal;
determining a code dependent static error based on a reference value and a steady-state value;
determining the dynamic behavior by determining a transient response of the DTC based on a transition in the output of the DTC in response to receiving the digital code and subsequently a different digital code;
generate a set of distortion data that removes the dynamic behavior from an output of the DTC based on the measured dynamic behavior.

18. The method of claim 17, further comprising:
measuring a time-varying error during a transition of the digital code to the different digital code.

19. The method of claim 17, further comprising:
setting a pre-determined number of clock cycles about a code transition of the digital code to the different digital code.

20. The method of claim 17, further comprising:
alternately receiving, via one of the DTC or another DTC, at a plurality of cycles, a current digital code that is incremented from a previously received digital code, respectively, while keeping an input of one of the DTC or the another DTC at a constant code; and
generating a plurality of differences of outputs based on the previous digital code of the DTC or of the another DTC, and the current digital code of the DTC or of the another DTC that did not receive the previous digital code.

21. The method of claim 20, further comprising:
modelling the dynamic behavior with the plurality of differences by generating a transient response function within a number of predetermined clock cycles; and
eliminating noise from the DTC based on a comparison of the differences to a steady state response of the DTC.

22. The method of claim 17, further comprising:
generating a transient response table comprising increment codes for incrementing the digital code based on a transient response of the DTC based on the dynamic behavior from a code transition.

* * * * *